(12) United States Patent
Gilbert

(10) Patent No.: US 7,483,294 B2
(45) Date of Patent: Jan. 27, 2009

(54) READ, WRITE, AND ERASE CIRCUIT FOR PROGRAMMABLE MEMORY DEVICES

(75) Inventor: Nad Edward Gilbert, Higley, AZ (US)

(73) Assignee: Adesto Technologies, Sunnyvale, CA (US)

(*) Notice: Subject to any disclaimer, the term of this patent is extended or adjusted under 35 U.S.C. 154(b) by 0 days.

(21) Appl. No.: 11/841,591

(22) Filed: Aug. 20, 2007

(65) Prior Publication Data

US 2007/0279976 A1    Dec. 6, 2007

Related U.S. Application Data

(63) Continuation of application No. 11/276,758, filed on Mar. 13, 2006, now Pat. No. 7,359,236.

(60) Provisional application No. 60/661,250, filed on Mar. 11, 2005.

(51) Int. Cl.
*G11C 11/00* (2006.01)
(52) U.S. Cl. .................................. 365/163; 365/158
(58) Field of Classification Search ................. 365/163, 365/158
See application file for complete search history.

(56) References Cited

U.S. PATENT DOCUMENTS

| | | | |
|---|---|---|---|
| 2004/0264244 A1* | 12/2004 | Morimoto | 365/180 |
| 2005/0093574 A1* | 5/2005 | Fujita | 326/41 |
| 2006/0209585 A1* | 9/2006 | Tanizaki et al. | 365/148 |
| 2007/0008768 A1* | 1/2007 | Daley | 365/148 |
| 2007/0121368 A1* | 5/2007 | Gilbert | 365/148 |
| 2007/0133255 A1* | 6/2007 | Farnworth | 365/148 |
| 2007/0159870 A1* | 7/2007 | Tanizaki et al. | 365/148 |
| 2007/0165442 A1* | 7/2007 | Hosoi et al. | 365/100 |
| 2008/0025077 A1* | 1/2008 | Scheuerlein et al. | 365/163 |

* cited by examiner

*Primary Examiner*—Michael T Tran
(74) *Attorney, Agent, or Firm*—Snell & Wilmer L.L.P.

(57) ABSTRACT

A circuit for writing, reading, and erasing a programmable device is disclosed. The programmable device includes an ion conductor and a plurality of electrodes. Electrical properties of the device are altered by applying a sufficient bias across the electrode to form a conductive region within the ion conductor. The circuit can be used to program and read multiple bits within a single programmable device.

14 Claims, 9 Drawing Sheets

READ, WRITE, AND ERASE CIRCUIT FOR PROGRAMMABLE MEMORY DEVICES

CROSS REFERENCE TO RELATED APPLICATIONS

This application is a continuation of application Ser. No. 11/276,758, now U.S. Pat. No. 7,359,236, entitled READ, WRITE AND ERASE CIRCUIT FOR PROGRAMMABLE MEMORY DEVICES, filed Mar. 13, 2006, which claims the benefit of U.S. Patent Application Ser. No. 60/661,250, entitled READ, WRITE AND ERASE CIRCUITS FOR PROGRAMMABLE METALLIZATION CELLS IN A NON-VOLATILE RANDOM ACCESS MEMORY, filed Mar. 11,2005.

FIELD OF INVENTION

The present invention generally circuits for reading, writing, and erasing information, and more particularly, to circuits that are suitable for use with programmable memory devices.

BACKGROUND OF THE INVENTION

Memory devices are often used in electronic systems and computers to store information in the form of binary data. These memory devices may be characterized into various types, each type having associated with it various advantages and disadvantages.

For example, random access memory ("RAM"), which may be found in personal computers, is typically volatile semiconductor memory; in other words, the stored data is lost if the power source is disconnected or removed. Dynamic RAM ("DRAM") is particularly volatile in that it must be "refreshed" (i.e., recharged) every few hundred milliseconds in order to maintain the stored data. Static RAM ("SRAM") will hold the data after one writing so long as the power source is maintained; once the power source is disconnected, however, the data is lost. Thus, in these volatile memory configurations, information is only retained so long as the power to the system is not turned off. In general, these RAM devices can take up significant chip area and therefore may be expensive to manufacture and consume relatively large amounts of energy for data storage.

One type of programmable semiconductor non-volatile memory device suitable for use in such systems is a programmable read-only memory ("PROM") device. One type of PROM, a write-once read-many ("WORM") device, uses an array of fusible links. Once programmed, the WORM device cannot be reprogrammed.

Other forms of PROM devices include erasable PROM ("EPROM") and electrically erasable PROM (EEPROM) devices, which are alterable after an initial programming. EPROM devices generally require an erase step involving exposure to ultra violet light prior to programming the device. Thus, such devices are generally not well suited for use in portable electronic devices. EEPROM devices are generally easier to program, but suffer from other deficiencies. In particular, EEPROM devices are relatively complex, are relatively difficult to manufacture, and are relatively large. Furthermore, a circuit including EEPROM devices must withstand the high voltages necessary to program the device. Consequently, EEPROM cost per bit of memory capacity is extremely high compared with other means of data storage. Another disadvantage of EEPROM devices is that, although they can retain data without having the power source connected, they require relatively large amounts of power to program. This power drain can be considerable in a compact portable system powered by a battery.

Due, at least in part, to a rapidly growing numbers of compact, low-power portable computer systems and hand-held appliances in which stored information changes regularly, low energy read/write semiconductor memories have become increasingly desirable and widespread. Furthermore, because these portable systems often require data storage when the power is turned off, non-volatile storage devices are desired for use in such systems.

Recently, programmable metallization cell (PMC) devices have been developed for use in such systems to replace DRAM, SRAM, PROM, EPROM, EEPROM, and similar devices. PMC devices offer advantages over traditional memory devices because PMC devices can be formed using amorphous material and can thus be added to existing devices formed on a semiconductor substrate. The PMC devices also typically have lower production cost and can be formed using flexible fabrication techniques, which are easily adaptable to a variety of applications. Further, the PMC devices may be scaled to less than a few square microns in size, the active portion of the device being less than on micron. This provides a significant advantage over traditional semiconductor technologies in which each device and its associated interconnect can take up several tens of square microns.

FIG. 1 illustrates a typical PMC device 100 formed on a surface of a substrate 110. Device 100 includes electrodes 120 and 130, an ion conductor 140, and an electrode 180. Generally, device 100 is configured such that when a bias greater than a threshold voltage ($V_T$) is applied across electrodes 120 and 130, the electrical properties of structure 100 change. For example, as a voltage $V \geq V_T$ is applied across electrodes 120 and 130, conductive ions within ion conductor 140 begin to migrate and form a conductive region (e.g., electrodeposit 160) at or near the more negative of electrodes 120 and 130. As the electrodeposit forms, the resistance between electrodes 120 and 130 decreases, and other electrical properties may also change. If the same voltage is applied in reverse, the electrodeposit will dissolve back into the ion conductor and the device will return to its high resistance state.

Because PMC devices have advantages over traditional semiconductor memory devices and can be used in a wide variety of applications, improved circuits for reading, writing, and erasing PMC devices are desired. Accordingly, circuits for programming the programmable PMC devices are desired.

SUMMARY OF THE INVENTION

The present invention provides improved circuits for use with programmable devices. More particularly, the invention provides programming circuits suitable for reading, writing, and erasing programmable metallization cell devices. Such circuits, including the corresponding programmable structures, can replace both traditional nonvolatile and volatile forms of memory.

The ways in which the present invention addresses various drawbacks of now-known circuits are discussed in greater detail below. However, in general, the present invention provides a programming circuit and a programmable device that are relatively easy and inexpensive to manufacture and are relatively easy to program.

In accordance with various embodiments of the invention, the circuit can be used to read, write, and erase multiple bits from a single PMC device. Thus, increased storage density can be achieved using the circuit of the present invention.

In accordance with one embodiment of the invention, a circuit for reading, writing, and erasing a programmable device includes an array of programmable metallization cells coupled together by a common anode. In accordance with various aspects of this embodiment, the circuit includes a low voltage supply coupled to the anodes of the PMC devices, a switch coupled to the cathode of the PMC device to select a row of PMC elements, a first current source coupled to the cathode and source voltage via a switch, a second current source coupled to the cathode and the low voltage supply via another switch, an equalizer coupled to the cathode, a current comparator coupled to a third current source, and a decoder coupled to the current comparator.

In accordance another embodiment of the invention, a circuit for reading, writing, and erasing a programmable device includes an array of programmable metallization cells coupled together by a common cathode. In accordance with various aspects of this embodiment, the circuit includes a low voltage supply coupled to the cathodes of an array of OMC devices, a switch coupled to the anode of the PMC device to select a row of PMC elements, a first current source coupled to the anode and the source voltage via a switch, a second current source coupled to the anode and the low voltage supply via another switch, an equalizer coupled to the anode, a current comparator coupled to a third current source and a decoder coupled to the current comparator.

In accordance with yet another embodiment of the invention, a circuit for writing a programmable device includes a common bias portion and a current selection portion. The current selection portion is used to generate a write current based on a number of bits to be stored in the PMC device, wherein the write resistance is equal to the threshold voltage of the PMC device divided by the selected programming current.

In accordance with yet another embodiment of the invention, a circuit for erasing a programmable device includes a common bias portion and a current selection portion to perform a current controlled erase of the PMC device.

In accordance with yet another embodiment of the invention, a circuit for reading a programmable device includes a common bias portion, a current comparator portion, and a read bias circuit. The read bias circuit is used to force a read bias across the PMC element to produce a current for comparison with the current comparator. The output from the comparator is decoded to output binary digital logic corresponding to the values stored in the PMC element.

BRIEF DESCRIPTION OF THE DRAWING FIGURES

Skilled artisans will appreciate that elements in the figures are illustrated for simplicity and clarity and have not necessarily been drawn to scale. The dimensions of some of the elements in the figures may be exaggerated relative to other elements to help to improve understanding of embodiments of the present invention.

DETAILED DESCRIPTION

The present invention provides a circuit for writing, reading, and erasing programmable devices. More particularly, the invention provides a circuit for writing, reading, and erasing a programmable metallization cell. As explained in greater detail below, exemplary circuits of the present invention can be used to read, write, and erase multiple bits in a single programmable device or to store a single bit of information in the device.

Figure 1:
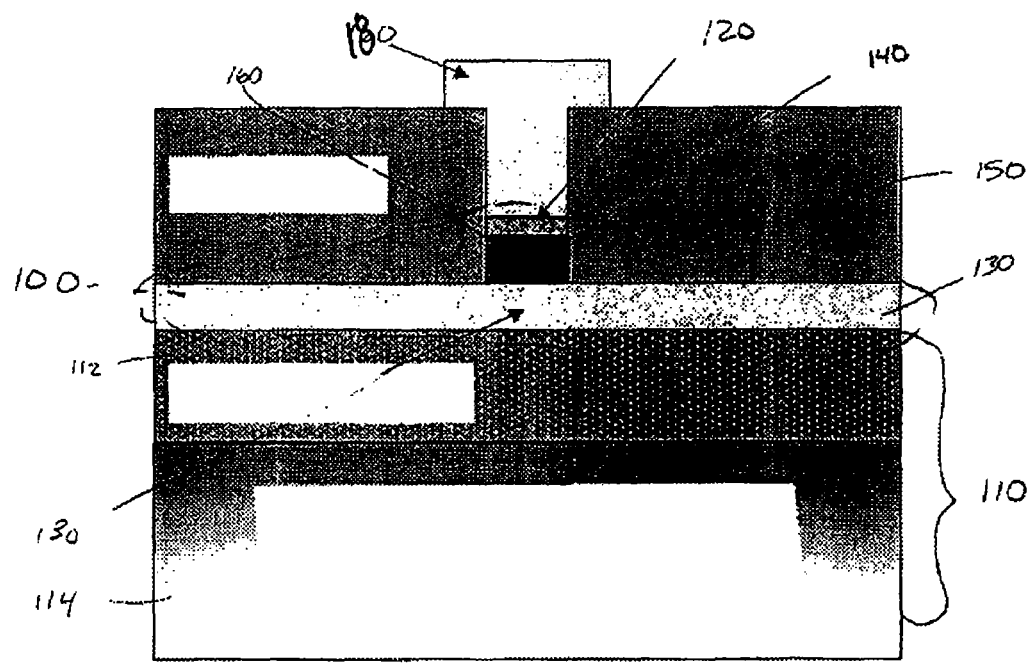
FIG. 1 illustrates a programmable metallization cell as known in the art.
Figure 2:
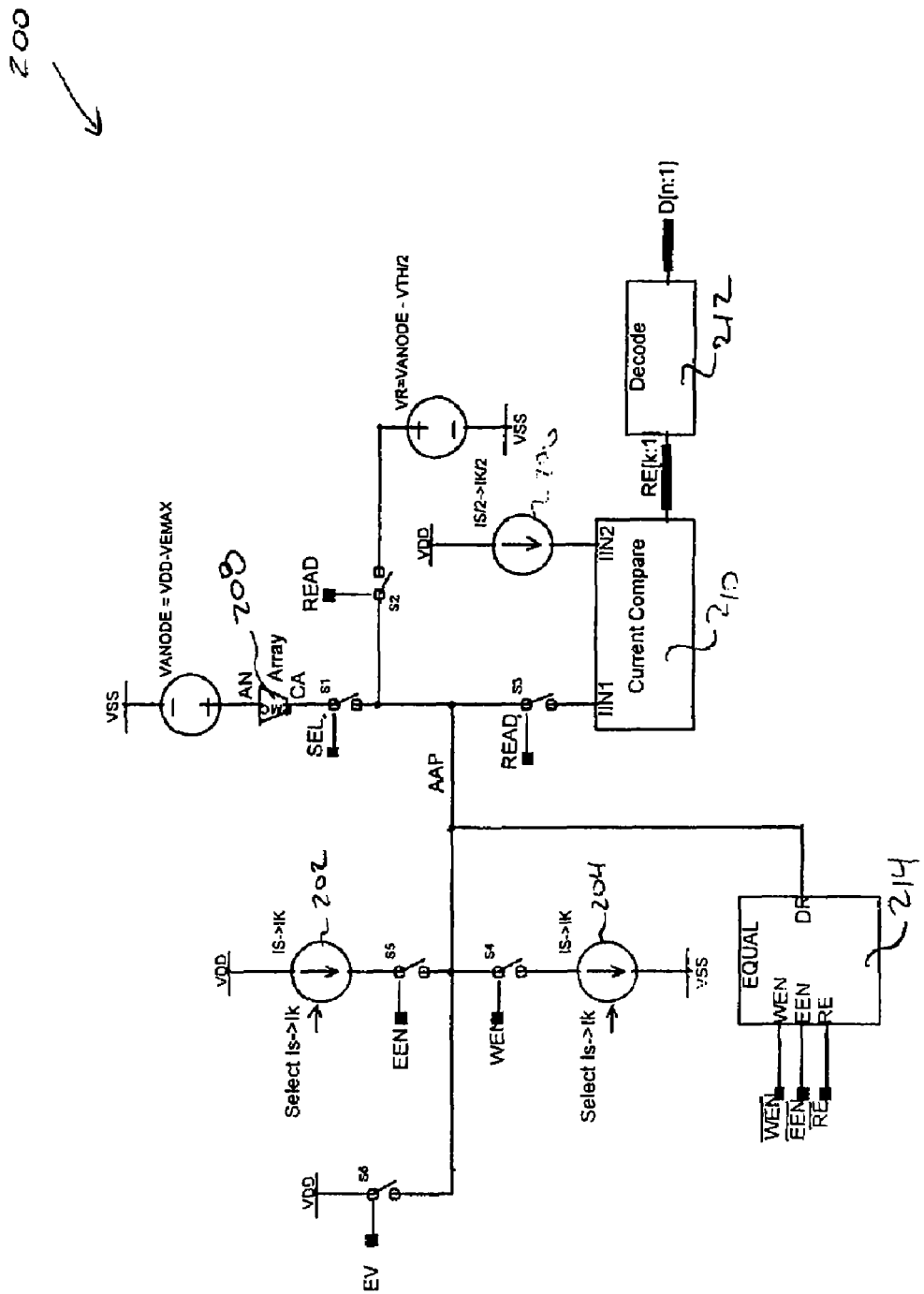
FIGS. 2-3 illustrate circuits for writing, reading, and erasing an array of programmable devices.

FIG. 2 illustrates a circuit 200 for programming an array of cells, such as cells set forth in FIG. 1, where anodes of each cell are tied to a common low-voltage source. A more detailed description of programmable cells including a common anode and common cathode configurations are set forth in U.S. Pat. No. 6,635,914, issued to Kozicki et al., entitled MICROELECTRONIC PROGRAMMABLE DEVICE AND METHODS OF FORMING AND PROGRAMMING THE SAME, the contents of which are hereby incorporated herein by reference.

An amount of a conductive region (e.g., dendrite 160) is proportional to the reduced "on" voltage of the device, which may have virtually infinite states. The circuit described below quantizes these resistance states to obtain digital states of the device. The PMC elements may be used to store a single bit or several bits. The erase resistance can also be quantized to increase the resistance of the PMC device from one state to another, or can be defined simply as the full off resistance of the device.

Circuit 200 includes a supply voltage Vdd, a low supply voltage Vss, switches S1-S6, current sources 202, 204, 206, PMC device 208, which is part of an array, a current comparator 210, a decoder 212, and an equalization circuit 214. Although illustrated with switches S1-S6, those skilled in the art appreciate that any suitable isolation device may be employed with the circuit of the present invention. In the illustrative example, the common anodes are coupled to a low-voltage supply, which is equal to the supply voltage, Vdd, minus the maximum erase voltage, $V_{EMAX}$, which can be applied across the device without causing a breakdown of the device.

Vdd is coupled to a cathode of a selected PMC element via switch S1 and switch S6. Current source 202 is coupled to Vdd and the cathode via switch S1 and switch S5. Current source 204 is coupled to the cathode via switch S1 and switch S4. Current comparator 210 is coupled to the selected cathode through switches S1 and S3, and a third current source 206 is coupled to comparator 210 and source voltage 210. Decoder 212 is coupled to the output of current comparator 210.

During operation of circuit 200, in accordance with the illustrative embodiment, a row is selected by closing S1, such that only one PMC element 208 is accessed at a time in a predefined column(s) and rows in the array. Once the element is selected, a write, read, or erase function can be performed.

To erase a device to a full off resistance, switch S6 is closed, which pulls a cathode voltage to the supply voltage, forcing a negative voltage, $V_{EMAX}$ across device 208, which causes a full erase or an increase in the resistance of device 208 to the off state voltage. The erase can also be performed by selecting current source 202, coupled to Vdd, through switch S5, and forcing current from the cathode to the anode of PMC device 208. It is noted that if a current less than the original write current of the device is selected (as described in more detail below), an erase step can be used to increase the on resistance of device 208 to a higher on resistance, rather than to perform a full erase of the device.

To write to device 208, device 208 is first erased to clear any previous resistance state, and then device 208 is programmed with a selected quantized current from Is to Ik, where k is the number of stages of device 208 and Is is the source bias current, by selecting the program current source through switch S4. The erase step can optionally be skipped to perform an incremental write from a high on resistance to a lower on resistance state.

During the write process, the current is pulled from the anode to the cathode of device 208, using current source 204 pulling toward Vss. The voltage limiting property of the device limits the voltage across the device to the threshold voltage Vt of the device, which is the potential required to perform the write function.

For the read operation, switch S2 is closed to force a read bias, equal to the anode voltage minus the one half of Vt across device 208. Device 208 is then used as a current source. The current generated by device 208 resistance and the read bias (VR) is then compared, using current comparer 210, to half of the currents Is to Ik. The comparison generates digital signals, which are decoded, using decoder 212, into binary digital outputs.

Equalization circuit 214 ensures that the column and row capacitance of the array are always forced to the anode voltage, when no operation is being performed, to prevent unwanted partial programming or erasing.

Figure 3:
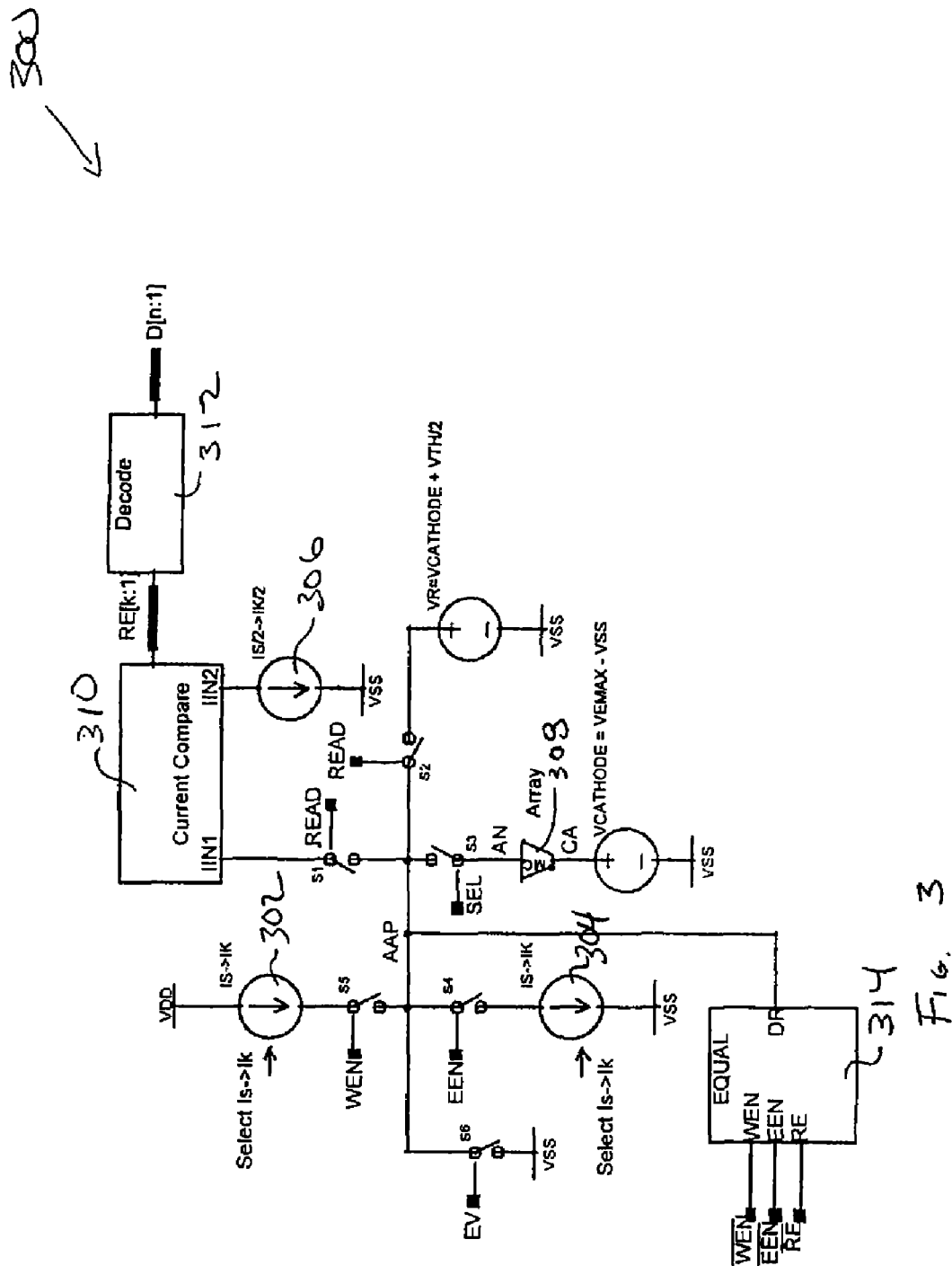

FIG. 3 illustrates a circuit 300 for programming an array of cells, such as cells set forth in FIG. 1, where the cathodes of each cell in an array are tied to a common voltage source. Similar to circuit 200, circuit 300 includes a supply voltage Vdd, a low supply voltage Vss, switches S1-S6, current sources 302, 304, 306, PMC device 308, which is part of an array, a current comparator 310, a decoder 312, and an equalization circuit 314 to ensure that the column and row capacitance of the array are always forced to the cathode voltage, when no operation is being performed, to prevent unwanted partial programming or erasing. The cathodes of each device 308 are tied to a low impedance source, which is equal to $V_{EMAX}$–Vss.

The operation of circuit 300 is similar to the operation of circuit 200. For the write operation, S5 is closed and current is pushed from the anode to the cathode from Vdd. For the erase step, S4 is closed and current is pulled from the cathode to the anode from the low supply, Vss. During the erase step, the anode of device 308 connects to Vss, which forces a negative bias of $V_{EMAX}$ across device 308, when switch S6 is closed. The bias forced across the device for the read operation is equal to the cathode voltage plus Vt divided by two.

Referring now to FIGS. 4-9 various portions of circuits 200 and 300 will be described in more detail.

Figure 4:
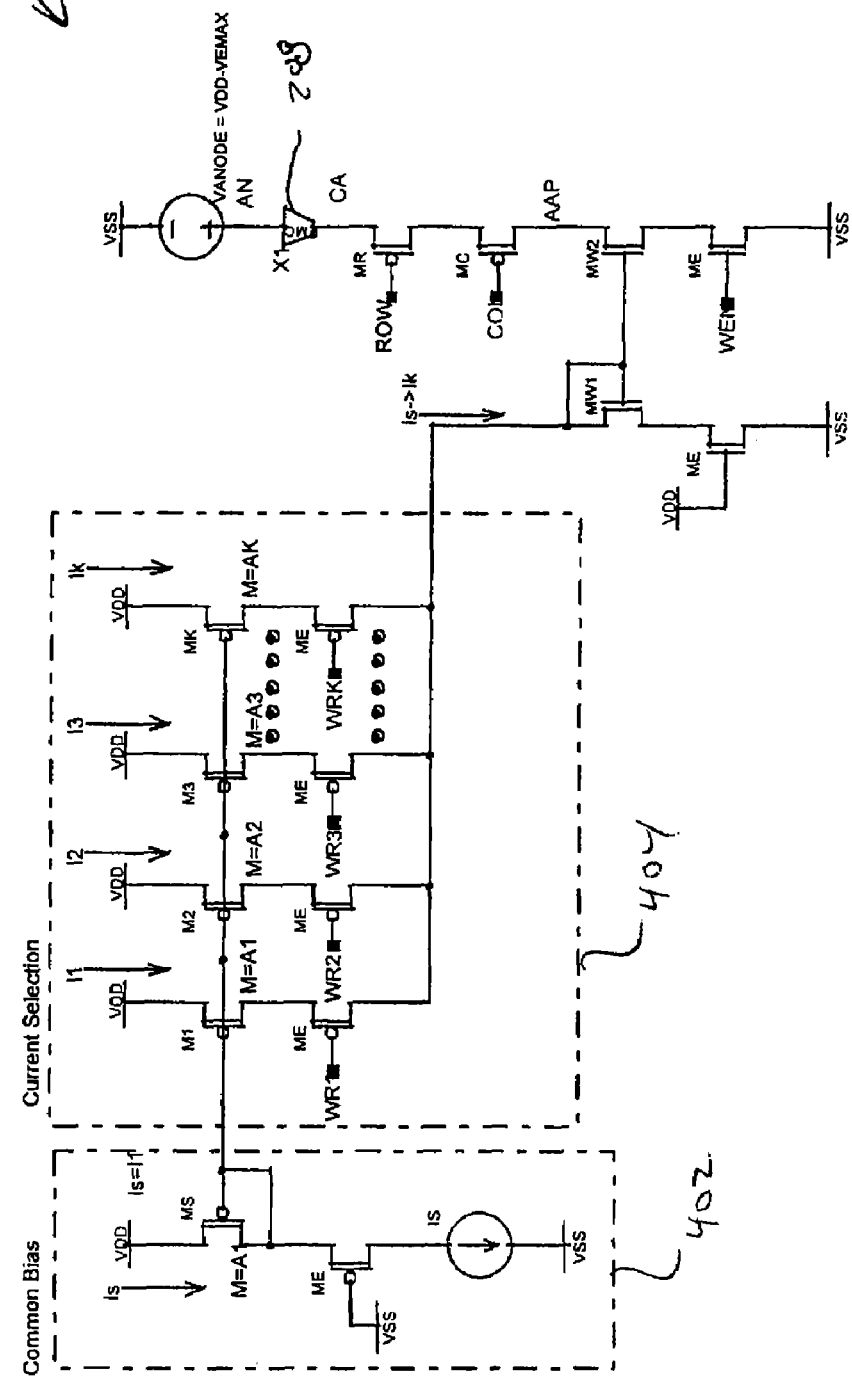
FIGS. 4-5 illustrate circuits for writing programmable device.
Figure 5:
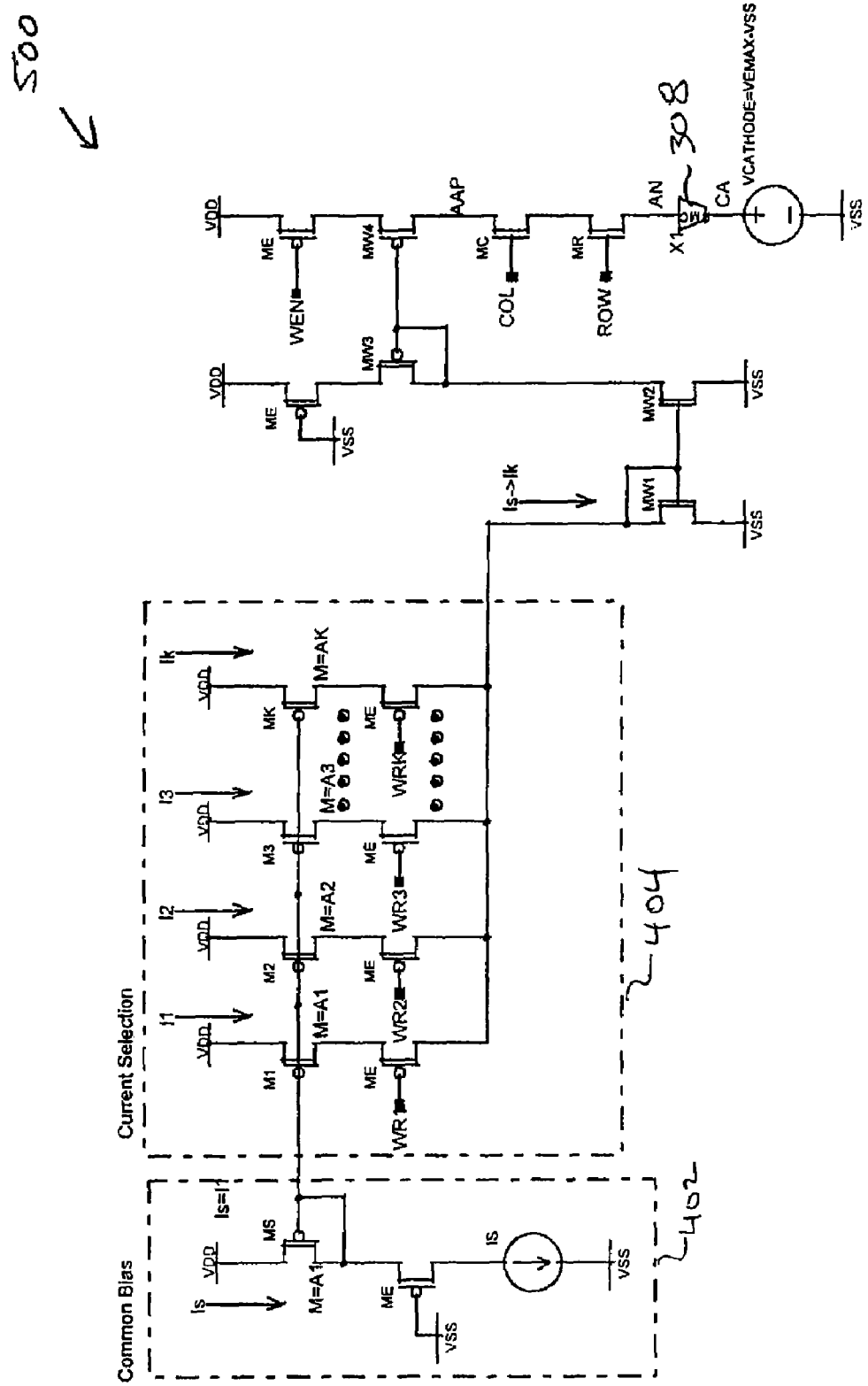

FIGS. 4 and 5 illustrate writes circuits 400 and 500, respectively. Circuit 400 includes a common bias portion 402, a current selection portion 404, voltage source Vdd, low-voltage source Vss, transistors Mr and Mc for row and column selection, transistors Mw1 and MW2, transistor ME. Circuit 500 includes a common bias portion 402, a current selection portion 404, transistors Me, Mr, and Mc, and transistors M1-M4 to replicate the desired current from current selection portion 404. Circuits 400 and 500 are configured to allow writing of multiple bits (n) to a programmable device—e.g., device 208 or 308.

Current selection is obtained by ratios of transconductance devices, which can be implemented with transistors, as illustrated. Transistors Mr and Mc are used for row and column selection, as described above. A common bias is used for all of the transistors, which generates Is from transistors Ms, Me, and current source Is. The individual currents I1, I2, I3 to Ik are generated by the transistor rations M=a1, M=a2, M=a3 to M=ak, where k is an integer. Each transistor defines a current leg, where the current in each leg is related by the ratio ak. The first current leg value I1 is equal to the source current Is. The transistor ratios are related to the size of the necessary element of the respective transistor. The transistor Me selects the desired current I1 to Ik to program the device, The appropriate current is then replicated through transistors Mw1 to Mw2 (Mw1-Mw4 for the common cathode configuration illustrated in FIG. 5).

Signal Wen allows the selected mirrored current to be pulled for the for the common anode configuration of FIG. 4 or pushed for the common cathode configuration of FIG. 5 out of or into devices 208, 308, respectively, causing the bias to quickly drop to Vt. The programmed resistance is then equal to Vt divided by the selected programming current. The discrete number of current sources creates the a number of resistance states of devices 208, 308 for multi-bit storage within each device 208, 308. For single-bit write circuits, only one current leg, M1, is required and no current selection is required.

Figure 6:
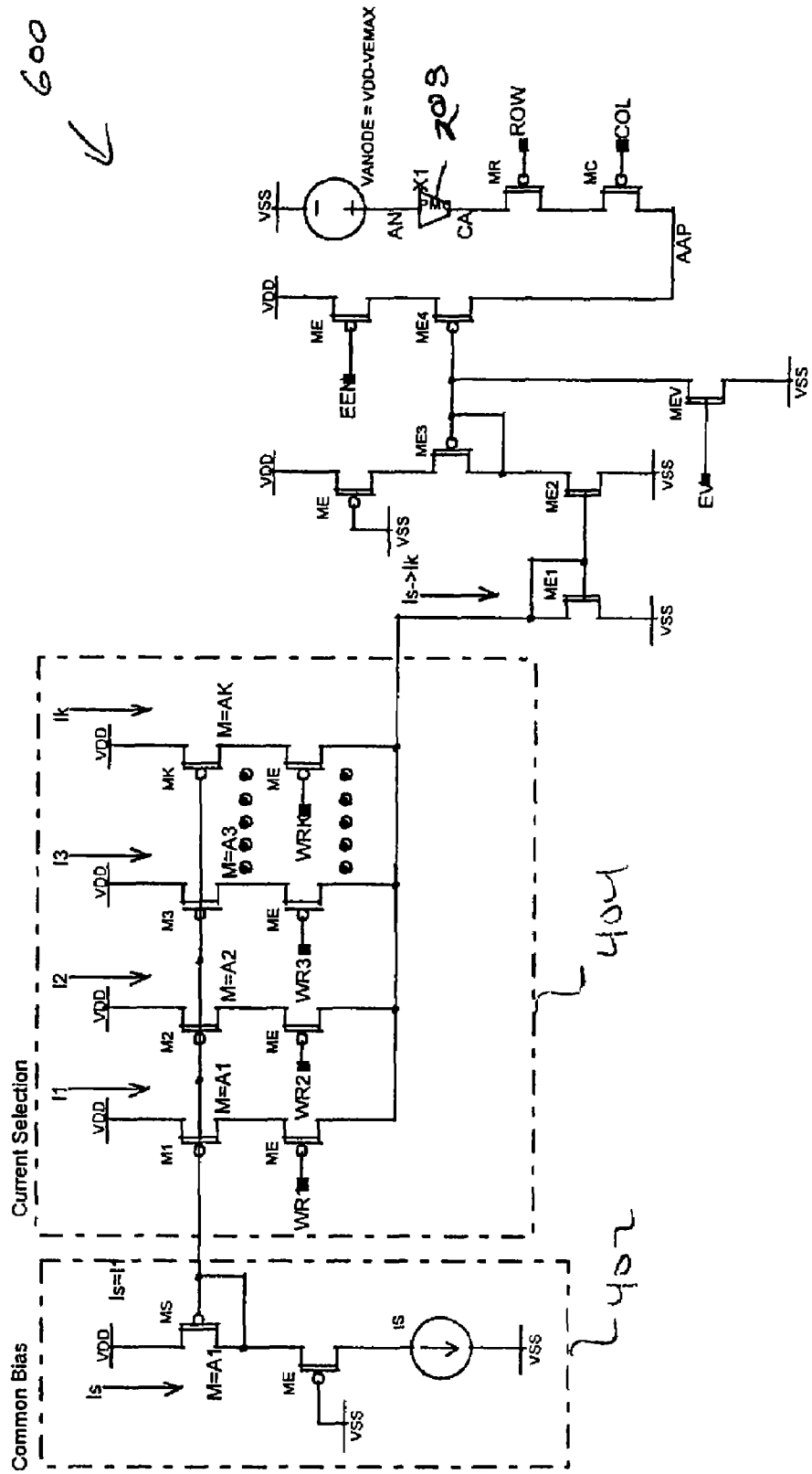
FIGS. 6-7 illustrate circuits for erasing programmable device.
Figure 7:
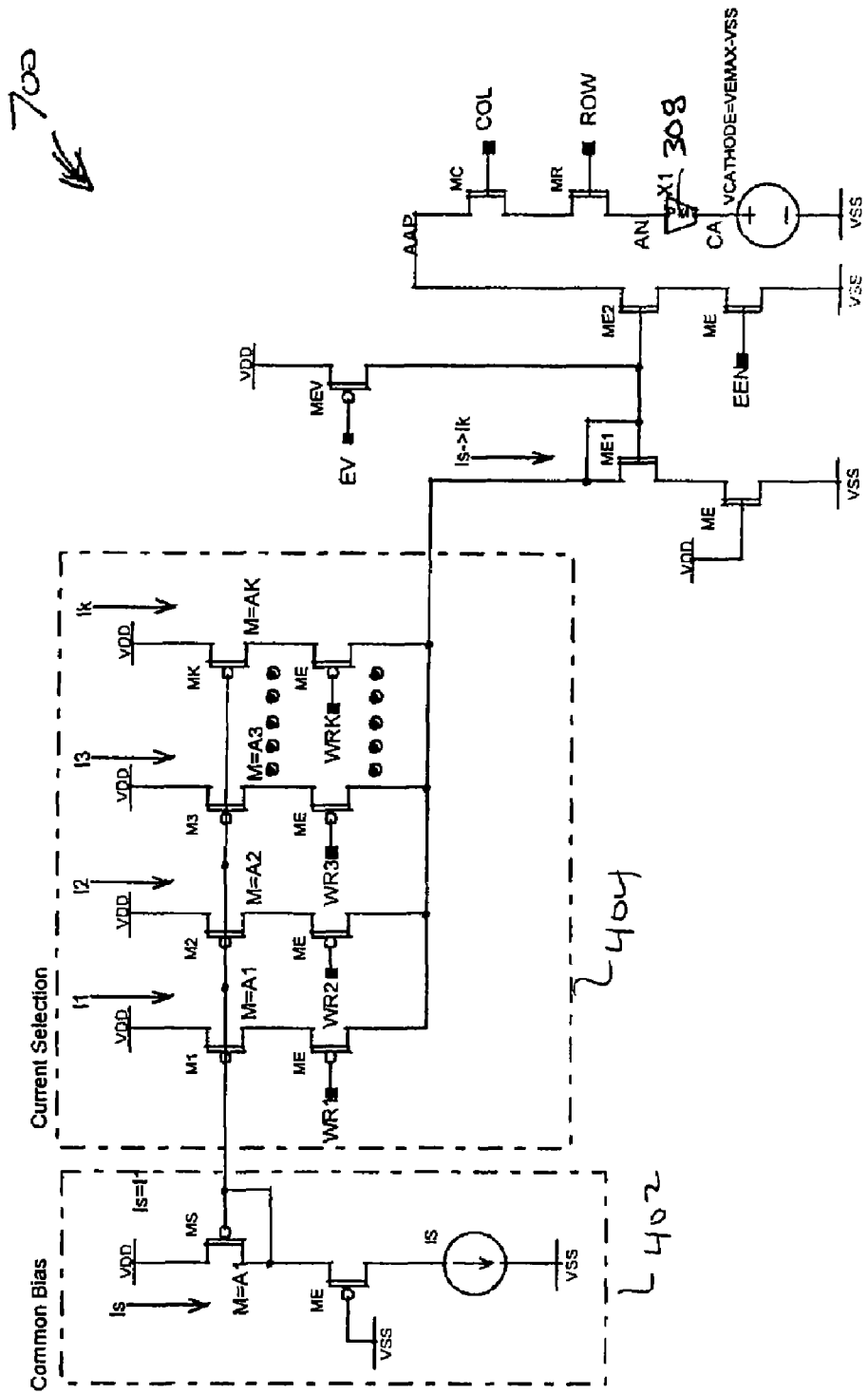

FIGS. 6 and 7 illustrate erase circuits 600 and 700, for a common cathode and a common anode array configuration, respectively. Transistors Mr and Mc are used for row and column selection, as described above. The same current selection and common bias devices used in the write operation are used in the erase operation circuit. Since generally only a fraction of the programming current is required to erase the device 208, 308, the selected programming current used for the erase will accomplish a full erase if it is the same current as that used for the programming current. Alternatively, the PMC can be partially erased from one on resistance to a higher one by using a current, which is less than the original programming current. Using the programming currents to erase the PMC device is defined as a current controlled erase.

To perform a current controlled erase, a desired erase current is selected and replicated through transistors Me1 to Me4 for the common anode configuration (FIG. 6) and Me1 to Me2 for the common cathode configuration (FIG. 7). The signal $E_{EN}$ allows the selected current to be pushed for the common anode circuit or pulled for the common cathode circuit into or out of respective PMC devices 208, 308. The voltage across the PMC device quickly rises and is limited by the voltage on the anode for the common cathode configuration or the cathode for the common cathode configuration and Vdd for the common anode circuit or Vss for the cathode circuit.

To perform a voltage erase, transistor Mev is turned on by the signal Ev and the sourcing or sinking transistors of the common anode or common cathode circuits, respectively, pull the cathode voltage or anode voltage to Vdd and Vss, causing a negative $V_{EMAX}$ to be forced across the PMC device to perform a full erase of the device.

Figure 8:
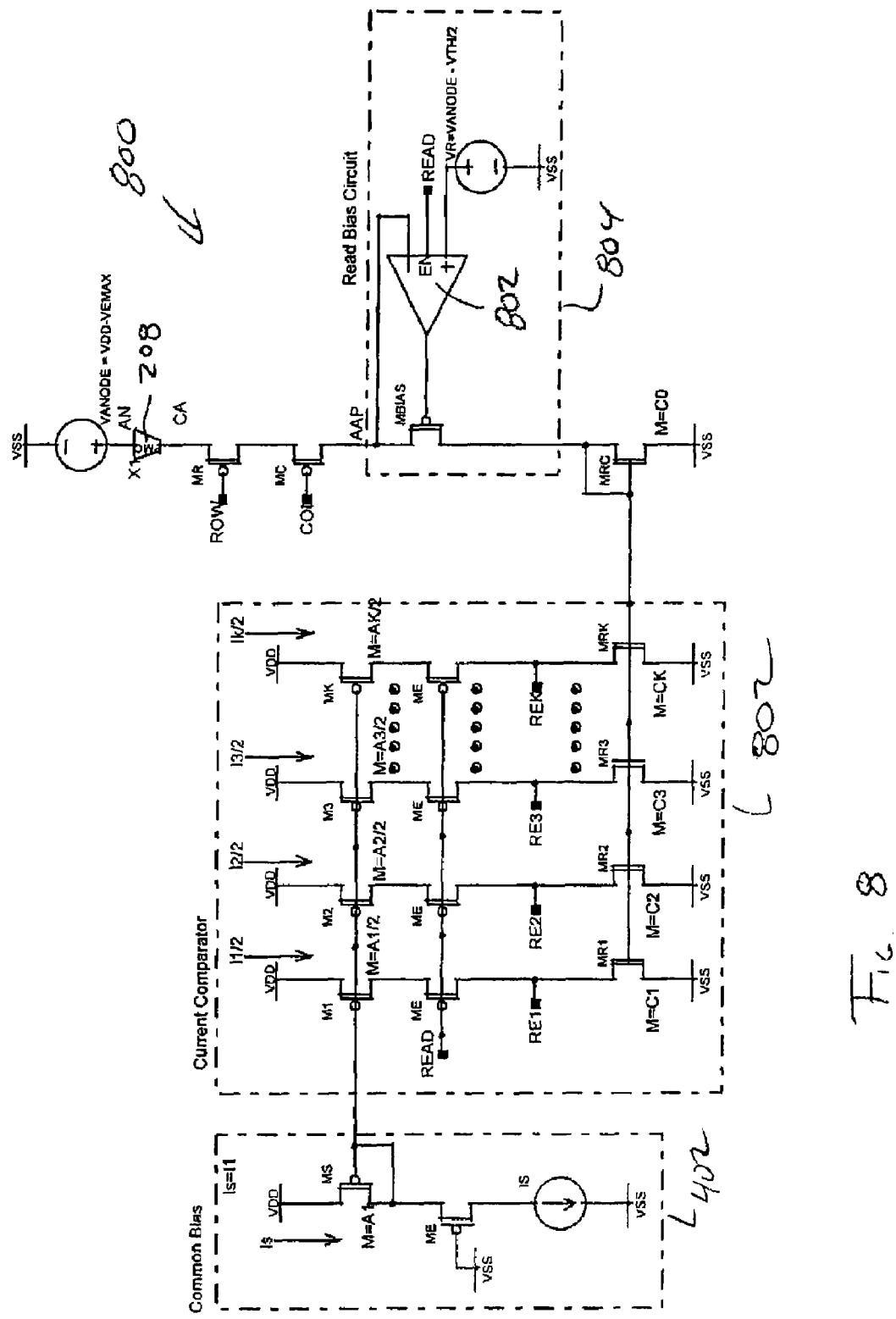
FIGS. 8-9 illustrate circuits for reading programmable device.
Figure 9:
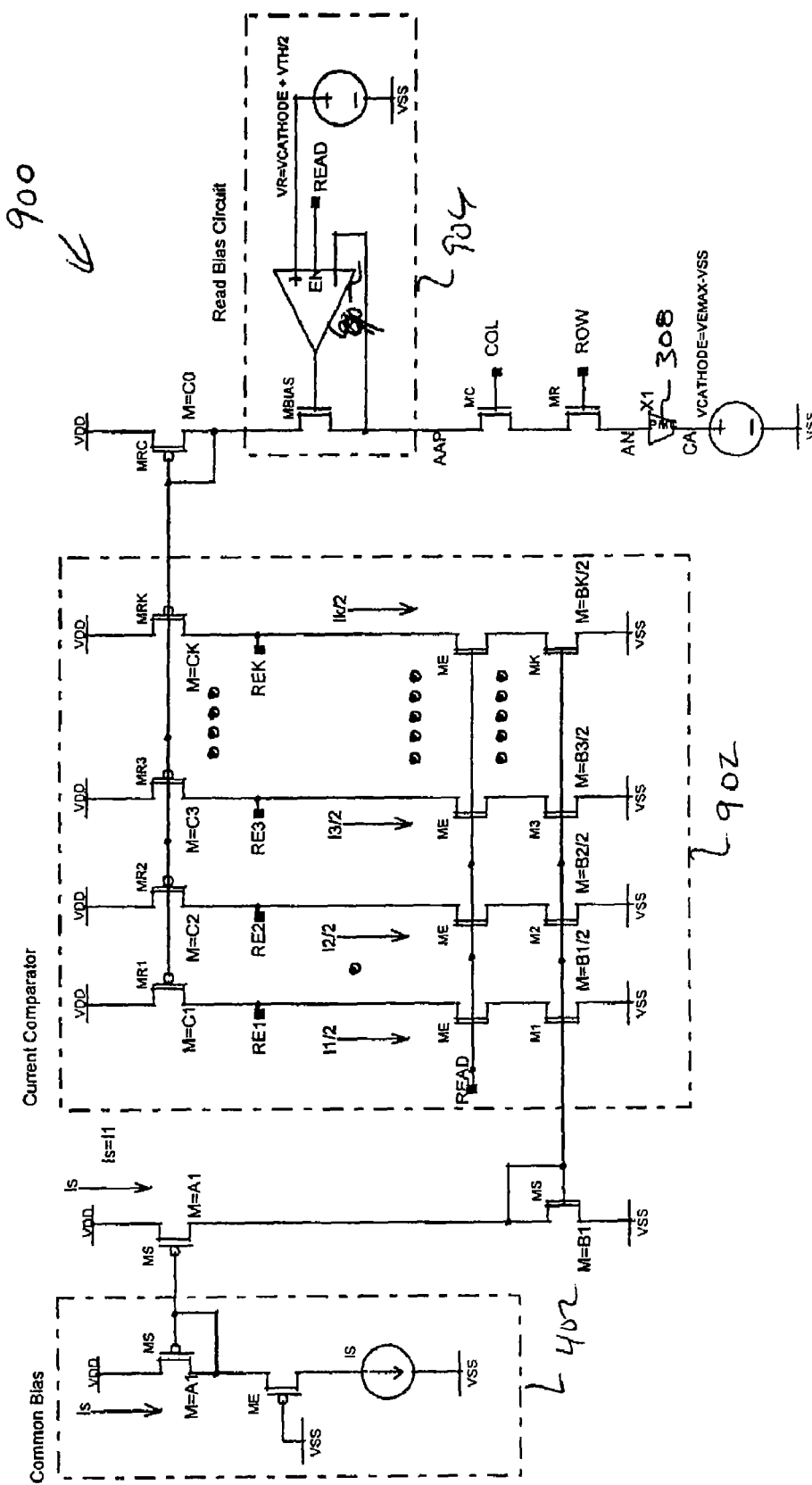

FIGS. 8 and 9 illustrate read circuits in accordance with the present invention for common anode and common cathode circuits, respectively. As noted above, transistors Mr and Mc are used for row and column selection to select a particular PMC element 208, 308.

Transistor $M_{BIAS}$ and amplifier 802, 902 are used to force the read bias of Vt/2 across the PMC device, in accordance with an exemplary embodiment of the invention. The signal READ enables the amplifier. Vt/2 was selected, so that the resistance state of the device is not disturbed by the read operation. Those skilled in the art will appreciate that other values may suitably be selected in accordance with other embodiments of the invention.

The current is then mirrored to current comparator 404 through transistor MRC. Common bias circuit 402 current is mirrored to current comparator circuit 802, 902 directly in the common anode circuit 800 and through MS in the common cathode circuit 900. The read bias circuits 804, 904 illustrated in FIGS. 8 and 9 are merely exemplary circuits. Other, alternative circuits could be used, as long as the circuit forces a constant bias across the PMC device to generate a current for comparison.

In exemplary current comparator circuit 802, 902, half of the source current is replicated in the same number of legs as the programming current selector circuit 404, with the same ratios divided by two. Since the read bias is half of Vt, the current generated is half of the programming current, which is why the ratios in current comparators 802, 902 are divided by two.

Each leg in current comparators 802, 902 compares current from the PMC device to one half of the respective source current. The voltage at node Re1 to Rek will pull high in the common anode circuit 800 if the PMC device current is less than the given programmed current and pull low if the PMC device current is greater than the source current. In the common cathode configuration, circuit 900, the voltage at Re1 to Rek pulls in the opposite direction. Transistors Mr1 to Mrk are scaled by C1 to Ck to ensure that the voltage Re1 to Rek do not fall at mid range value, so a comparator is not needed. The bias across the PMC device and the size ratios of the transistors in current comparators 802, 902 can also be changed to produce the same effect. The output is then edge enhanced with inverters and decoded to output binary digital logic corresponding to the values stored in memory.

The number of current legs for n bits is $k=2^{n-1}$, where k and n are both integers. An off resistance may correspond to the low values for a digital word of n bits, the resistance associated with Ik corresponds to the high values for the digital work of n bits, and the resistance associated with I1 to Ik−1 corresponds to the binary combinations of the digital word of n bits in a multi-bit PMC device. In a single-bit PMC device, an off resistance may correspond to a digital low and an on resistance, programmed with Is, corresponds to a digital 1, with Re1 being the single output. The single bit read is performed in the same way, except only one current leg is required.

Although the present invention is set forth herein in the context of the appended drawing figures, it should be appreciated that the invention is not limited to the specific form shown. Various modifications, variations, and enhancements in the design and arrangement of the method and apparatus set forth herein, may be made without departing from the spirit and scope of the present invention as set forth in the appended claims.

I claim:

1. A method of programming a programmable variable resistance cell, said method comprising:
   forcing a programming current into the programmable variable resistance cell for a predetermined period of time, wherein the programming current instigates a decrease of a resistance in the programmable variable resistance cell;
   allowing said programmable variable resistance cell to limit a voltage across said variable resistance cell to a threshold voltage for programming of the programmable variable resistance cell when said programming current is forced into said programmable variable resistance cell, wherein a programmed resistance of the programmable variable resistance cell is proportional to said threshold voltage divided by said programming current; and
   generating said programming current from a quantized number of current sources, the quantized number corresponds to a number of resistance states of the programmable variable resistance cell.

2. The method as recited in claim 1, wherein forcing a programming current into the programmable variable resistance cell reduces the resistance from one programmed state to a lower resistance of a lower programmed state without starting from a full erase state.

3. A method of sensing a resistance of a programmable variable resistance cell, said method comprising:
   forcing a read bias across the programmable variable resistance cell to form a generated read current;
   measuring the generated read current by said read bias across said programmable variable resistance cell;
   comparing said generated read current to a programming current reduced by the ratio of said read bias and a threshold voltage for programming said programmable variable resistance cell; and
   generating a digital output from said comparing step, the digital output corresponding to said resistance state sensed.

4. The method as recited in claim 3, wherein said comparing step comprises:
   comparing the generated read current to a quantized number of programming currents reduced by the ratio of said read bias and said threshold voltage to an output digital value corresponding to the current level of said generated read current; and
   converting said digital value to a binary output corresponding to said digital value.

5. A method of erasing a programmable variable resistance cell, said method comprising:
   forcing an erase current from a constant current source into the programmable variable resistance cell for a predetermined period of time, wherein the erase current instigates an increase of resistance in the programmable variable resistance cell; and
   generating said erase current by a quantized number of constant current sources, wherein said quantized number corresponds to a number of resistance states available to be stored in the programmable variable resistance cell.

6. The method as recited in claim 5, wherein forcing an erase current into the programmable variable resistance cell for a predetermined period of time increases the resistance of the programmable variable resistance cell to a higher resistance value, wherein the resistance is not a resistance of a complete erase of the programmable variable resistance cell.

7. A memory circuit, comprising:
   an array of programmable variable resistance cells, wherein each programmable variable resistance cell comprises an anode and a cathode, wherein, when a programming bias is applied across said anode and said cathode in a first direction a reduction in resistance in said programmable variable resistance cell is obtained, and an increase in resistance is obtained when a voltage threshold for an erase is developed in a second direction;
   said array of programmable variable resistance cells includes a plurality of variable resistance cells coupled together with a common anode, wherein said plurality of programmable variable resistance cells are isolated by isolation switches on an uncommon terminal;

a first distinct number of current sources switchably connected to the plurality of programmable variable resistance cells through said isolation switches for forcing a programming current into at least one of the plurality of programmable variable resistance cells;

a second distinct number of current sources switchably connected to the plurality of programmable variable resistance cells through said isolation switches for forcing an erase current into at least one of the plurality of programmable variable resistance cells;

a switch connected to a supply voltage to force a negative voltage across at least one of the plurality of programmable variable resistance cells;

a circuit to force a read bias across at least one of the plurality of programmable variable resistance cells to form a produced current;

a measurement circuit to measure the produced current to form a measured current;

a current comparison circuit to compare the measured current to one or more reference currents to form a compared value;

a circuit to convert the compared value to digital output; and a circuit to convert the digital output to a binary output.

8. The memory circuit of claim 7, wherein said array of programmable variable resistance cells includes a plurality of variable resistance cells coupled together with a common cathode.

9. The memory circuit of claim 7, wherein said isolation switches, current sources, measurement circuit, current comparison circuit, circuit to convert, and circuit to force a read bias are implemented with transistors.

10. The memory circuit of claim 7, wherein said circuit consists of one current source and one reference current.

11. The memory circuit of claim 7, wherein said circuit to force a read bias across at least one of the plurality of programmable variable resistance cells and said current measurement circuit comprise an operational amplifier including a positive input coupled to a voltage reference, a negative input coupled to the output of a regulation transistor, which is coupled to said memory array, and an output coupled to a gate of said regulation transistor, and a third terminal of said regulation transistor is connected to a diode connected transistor.

12. A circuit for generating related programming currents and read references currents comprising:

a common bias source coupled to a plurality of transconductance devices;

a discrete number of transconductance devices used as current sources for producing districted programming currents having current values dependent on a ratio of a size of the transconductance devices; and a discrete number of transconductance devices used as current sources to produce read reference currents, each of said discrete number of transconductance devices having a size proportional to a ratio of a read bias and a threshold voltage for programming said programmable variable resistance cell.

13. The memory circuit of claim 12, wherein said transconductance devices are implemented with transistors.

14. The memory circuit of claim 12, wherein said ratio of said read bias and said threshold voltage for programming said programmable variable resistance cell is 1:2.

* * * * *